(12) United States Patent
Besse et al.

(10) Patent No.: US 8,680,621 B2
(45) Date of Patent: Mar. 25, 2014

(54) INTEGRATED CIRCUIT, ELECTRONIC DEVICE AND ESD PROTECTION THEREFOR

(75) Inventors: Patrice Besse, Toulouse (FR); Jean Philippe Laine, Cugnaux (FR)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/695,670

(22) PCT Filed: May 18, 2010

(86) PCT No.: PCT/IB2010/001631
§ 371 (c)(1),
(2), (4) Date: Nov. 1, 2012

(87) PCT Pub. No.: WO2011/144960
PCT Pub. Date: Nov. 24, 2011

(65) Prior Publication Data
US 2013/0056792 A1 Mar. 7, 2013

(51) Int. Cl.
*H01L 23/62* (2006.01)
*H01L 29/72* (2006.01)
*H01L 29/74* (2006.01)
*H01L 31/111* (2006.01)
*H01L 29/73* (2006.01)
*H01L 21/8222* (2006.01)

(52) U.S. Cl.
USPC ........... 257/355; 257/173; 257/174; 257/361; 257/362; 257/E21.388; 257/E21.389; 257/E21.392; 257/E29.211; 257/E29.225; 257/E29.337; 438/340

(58) Field of Classification Search
USPC .......... 257/173, 174, 361, 362, 355, E21.388, 257/E21.389, E21.392, E29.211, E29.225, 257/E29.337; 438/340
See application file for complete search history.

(56) References Cited

U.S. PATENT DOCUMENTS

| | | | | |
|---|---|---|---|---|
| 5,895,940 A * | 4/1999 | Kim | ............................. | 257/173 |
| 5,903,420 A * | 5/1999 | Ham | ............................. | 361/56 |
| 5,905,679 A * | 5/1999 | Tsukikawa | .............. | 365/189.06 |
| 6,258,634 B1 | 7/2001 | Wang et al. | | |
| 6,400,542 B1 * | 6/2002 | Lee et al. | ........................ | 361/56 |
| 6,472,286 B1 * | 10/2002 | Yu | ................................ | 438/342 |
| 6,512,662 B1 | 1/2003 | Wang | | |
| 6,603,177 B2 * | 8/2003 | Tang et al. | .................... | 257/355 |
| 6,784,029 B1 | 8/2004 | Vashchenko et al. | | |
| 6,803,633 B2 | 10/2004 | Mergens et al. | | |

(Continued)

OTHER PUBLICATIONS

International Search Report and Written Opinion correlating to PCT/IB2010/001631 dated Feb. 7, 2011.

*Primary Examiner* — Ida M Soward

(57) ABSTRACT

An integrated circuit comprising electro-static discharge (ESD) protection circuitry arranged to provide ESD protection to an external terminal of the integrated circuit. The ESD protection circuitry comprises: a thyristor circuit comprising a first bipolar switching device operably coupled to the external terminal and a second bipolar switching device operably coupled to another external terminal, a collector of the first bipolar switching device being coupled to a base of the second bipolar switching device and a base of the first bipolar switching device being coupled to a collector of the second bipolar switching device. A third bipolar switching device is also provided and operably coupled to the thyristor circuit and has a threshold voltage for triggering the thyristor circuit, the threshold voltage being independently configurable of the thyristor circuit. The first and second switching devices are arranged so as to provide, when in use, a bidirectional snapback characteristic and a snapback voltage associated therewith.

19 Claims, 3 Drawing Sheets

(56) References Cited

U.S. PATENT DOCUMENTS

| | | |
|---|---|---|
| 6,841,829 B1 | 1/2005 | Vashchenko et al. |
| 6,933,588 B1 | 8/2005 | Vashchenko et al. |
| 6,946,690 B1 | 9/2005 | Vashchenko et al. |
| 7,141,831 B1 | 11/2006 | Vashchenko et al. |
| 7,202,114 B2 | 4/2007 | Salcedo et al. |
| 7,238,553 B1 | 7/2007 | Vashchenko et al. |
| 7,238,865 B2 | 7/2007 | Bressan et al. |
| 7,309,905 B2 | 12/2007 | Yu et al. |
| 7,332,748 B2 | 2/2008 | Kodama et al. |
| 7,408,754 B1 | 8/2008 | O et al. |
| 8,107,203 B2 * | 1/2012 | Nagai ............................ 361/56 |
| 8,278,684 B1 * | 10/2012 | Walker et al. .................. 257/173 |
| 2005/0133873 A1 * | 6/2005 | Li et al. ......................... 257/362 |
| 2006/0220137 A1 * | 10/2006 | Kuroda et al. ................. 257/361 |
| 2009/0261378 A1 * | 10/2009 | Salcedo et al. ................ 257/127 |
| 2010/0008002 A1 | 1/2010 | Sorgeloos |

\* cited by examiner

INTEGRATED CIRCUIT, ELECTRONIC DEVICE AND ESD PROTECTION THEREFOR

FIELD OF THE INVENTION

This invention relates to an integrated circuit, electronic device and electro-static discharge (ESD) protection therefor.

BACKGROUND OF THE INVENTION

It is well known in the field of integrated circuit (IC) design and manufacture to provide protection to IC packages against electro-static discharge (ESD) events. ESD events are occurrences of short, fast and high amplitude electrical current pulses caused by the transfer of electrical charge between two bodies of different potential.

For analogue applications, and in particular for analogue applications requiring a high standard of reliability, ESD protection circuitry is required to provide protection against significant ESD. Examples of such applications include, by way of example, automotive systems, such as anti-lock brake systems (ABS), airbag deployment systems, electronic stabilisation program (ESP) systems, etc.

For such applications requiring a high standard of reliability, it is known for circuitry to be subjected to ESD gun testing, such as that defined in International Electrotechnical Commission (IEC) 61000-4-2, as published on 30 May 2005, and International Standards Organisation (ISO) standard ISO 10605 as published on 7 Jul. 2008. In such testing, an ESD pulse is generated by a 'gun', and applied to the pins of an IC under test. The ESD gun may be charged up to 25 kVolts prior to being discharged through a resistor of 330 Ohms or 2 Kohms, depending upon the specification. Thus, the current peak can reach 90 Amps.

In the field of automotive electronics, the so-called Local Interconnect Network (LIN) bus is a vehicle bus standard specified by the LIN consortium. In relation to devices intended to operate on a LIN bus, the standards identified above and the LIN conformance specification together require a pin that is to be coupled to the LIN bus to withstand the gun test at +8 kV and −8 kV for a peak current close to 30.

In order to protect an integrated circuit from ESD events, a so-called Silicon-Controlled Rectifier (SCR) circuit is known to provide adequate protection against such ESD events for many applications. In this respect, an SCR circuit has so-called "snapback" characteristics and so has an associated current-voltage characteristic that is S-shaped in a forward direction. The SCR is therefore able to provide an open circuit between a first terminal and a second terminal when a voltage applied across the first and second terminals is positive, but less than a predetermined trigger voltage. The first terminal is coupled to a node in the integrated circuit that is to be protected, and the second terminal is typically coupled to ground potential.

However, when the voltage applied across the first and second terminals matches or exceeds the trigger voltage, a low resistance current path is provided between the first and second terminals and is maintained until the voltage applied across the first and second terminals falls below a predetermined holding or snapback voltage. The snapback voltage is less than the trigger voltage. The SCR circuit described above is not bidirectional and can only handle ESD events that have a positive polarity.

U.S. Pat. No. 6,784,029 describes a structure that provides an SCR that supports bi-directional triggering and an adjustable trigger voltage. In this respect, an n-type epitaxial layer is formed on a p-type substrate. A first p-region and a second p-region are formed in the n-type epitaxial layer and a first p+ region is formed in the first p-region and a first n+ region is formed in the first p-region, the first p+ region and the first n+ region being laterally spaced with respect to each other. Similarly, a second p+ region is formed in the second p-region and a second n+ region is formed in the second p-region, the second p+ region and the second n+ region being laterally spaced with respect to each other. The first p+ region and the first n+ region are coupled to a first common contact and the second p+ region and the second n+ region are coupled to a second common contact. During operation, the first p-region, the n-type epitaxial layer and the second p-region of the structure provide a PNP transistor. Similarly, the second n+ region, the second p-region and the n-type epitaxial region of the structure provide an NPN transistor to which the PNP transistor is coupled to form a thyristor circuit.

Whilst the above thyristor circuit has an adjustable trigger voltage by using the PNP transistor having a "floating" base terminal (the base-emitter junction has a very high impedance), a very low capacitive current is allowed to make the base-emitter junction of the PNP transistor forward biased. Consequently, an electric current of an ElectroMagnetic Interference (EMI) event causes the PNP transistor to switch to an on-state and drive current during the EMI event. Also, the SCR circuit of U.S. Pat. No. 6,784,029 is triggered by virtue of triggering of the NPN transistor.

SUMMARY OF THE INVENTION

The present invention provides an electronic device and an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
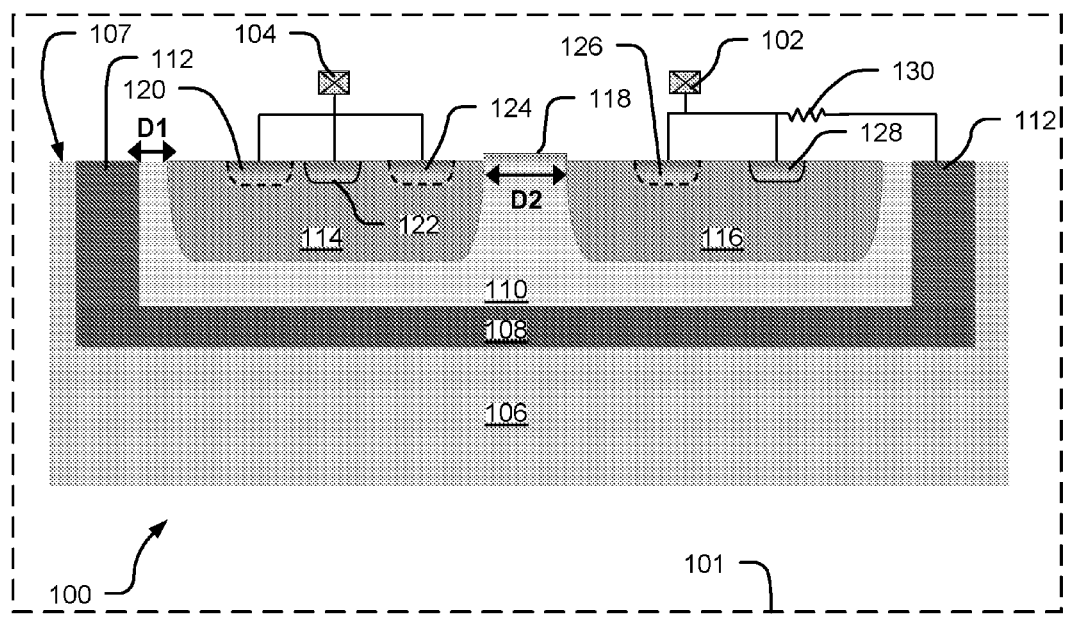
FIG. 1 schematically shows a cross-sectional view of an example of an Electro-Static Discharge (ESD) circuit constituting an embodiment of the invention.

Before describing in detail embodiments that are in accordance with the invention, it should be observed that the various apparatus components described herein, and as shown in the accompanying drawings, have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

Referring now to FIG. 1, the example of an integrated circuit (IC) 101 shown therein, for example of an electronic device, comprises an electro-static discharge (ESD) protection circuit 100. The ESD circuit 100 is coupled to an external terminal, for example an external pin 102. The ESD circuit 100 is also coupled to another external terminal, for example another external pin 104.

As will be appreciated by a skilled artisan, the use of the term 'pins' herein, and in the claims, is not limiting, and may refer to any alternative form of connector. For example, in a case of IC packages comprising ball grid arrays, the connectors are in a form of balls of solder, or the like. For purposes, the terms 'pin' and 'pins' are used herein to refer to connectors with which the IC is capable of establishing external electrical connections to components outside IC package. Such electrical connections may be in a form of data connections, voltage supply connections, ground connections, etc. It will be understood that the use of such terms is not limiting, and may refer to any suitable form of connection.

Referring back to FIG. 1, the shown ESD circuit 100 comprises a p-type substrate 106 having an original surface 107, for example a silicon substrate, over which, in this example, an n-type buried layer 108 is formed. Thereafter, in order to bury the n-type layer 108, an n-type epitaxial layer 110 is grown over the n-type layer 108. The n-type epitaxial layer 110 is then etched in order to form a peripheral trench in which n-type material is deposited in order to form a lateral isolation region 112. In this respect, lateral is defined as the direction parallel to the original surface 107 of the substrate 106, i.e. prior to formation of the buried layer 108. As shown in the example of FIG. 1, the epitaxial layer 110 is provided at both sides with a respective lateral isolation region 112 which extends from the top of the epitaxial layer 110 to the buried layer 108. The buried layer 108 together with the lateral isolation regions 112 isolate the epitaxial layer 110 electrically from other parts of the substrate 106. In this example, the buried layer 108 physically separates, together with the lateral isolation regions 112, the epitaxial layer from the other parts of the substrate at the sides and bottom of the epitaxial layer. Although in the cross-sectional view of FIG. 1 only two, opposite, side walls are shown, it will be apparent that, seen in a top view, the lateral isolation region may encircle the epitaxial layer entirely.

A first p-region 114 is then formed in the epitaxial layer 110 and a second p-region 116 is also formed in the epitaxial layer 110. In this example, the first and second p-regions 114, 116 are provided at the top surface of the epitaxial layer 110 and extend to a depth less than the thickness of the epitaxial layer. Thus, the first and second layers 114, 116 are separated from the buried layer 108 by the epitaxial layer 110. The first and second p-regions 114, 116 are laterally spaced with respect to each other. The lateral spacing, $D_2$, between the first and second p-regions 114, 116 dictates a snapback voltage, $V_{SB}$, parameter, which is the maximum voltage between the collector and the emitter of the PNP transistor 200 that can be achieved when the PNP transistor 200 is in an on state and at a low collector-emitter current, as will be explained in greater detail later herein. The snapback or latch current is therefore also tuneable. The first and second p-regions 114, 116 are separated by a thick oxide layer 118. Alternatively, a shallow isolation trench can be formed between the first and second p-regions 114, 116.

A first n+ region 120, a first p+ region 122 and a second n+ region 124 are each formed in the first p-region 114. The first n+ region 120 and the second n+ region 124 are separated by the first p+ region 122 disposed therebetween. In this example, the first p+ region 122 is situated, in the lateral direction, between the first n+ region 120 and the second n+ region 124. The regions 120, 122, 124 are situated at the top surface of the first p-region 114 and extend to a depth less than the depth of the first p-region 114. Thus, the regions 120, 122 and 124 are separated from the epitaxial layer 110 by the first p-region 114. The first n+ region 120 is laterally spaced with respect to the first p+ region 122, and the second n+ region 124 is laterally spaced with respect to the first p+ region 122. The first n+ region 120, the first p+ region 122 and the second n+region 124 are coupled to the another external terminal 104, the another external terminal 104 constituting a first common contact to be coupled to a reference potential, for example ground potential.

Similarly, a third n+ region 126 and a second p+ region 128 are formed in the second p-region 116, the third n+ region 126 and the second p+ region 128 being laterally spaced with respect to each other. In this example, the third n+ region 126 is situated, in the lateral direction, adjacent the second p+ region 128. The regions 126, 128 are situated at the top surface of the second p-region 116 and external to a depth less than the depth of the second p-region 116. Thus, the regions 126, 128 are separated from the epitaxial layer 110 by the second p-region 116. The third n+ region 126 is coupled to the external terminal 102, a first terminal of an external resistance 130 and the second p+ region 128. The external resistance 130 serves as a biasing element. The external resistance 130 serves to bias the buried layer 108 and constitutes a biasing element, thereby ensuring that the impedance of base-emitter junction of a PNP transistor (200 in FIG. 2) is not very high and hence not floating. A second terminal of the external resistance 130 is coupled to the lateral isolation region 112. The external terminal 102 constitutes a second common contact and is coupled to a circuit pin (not shown) to be protected.

Figure 2:
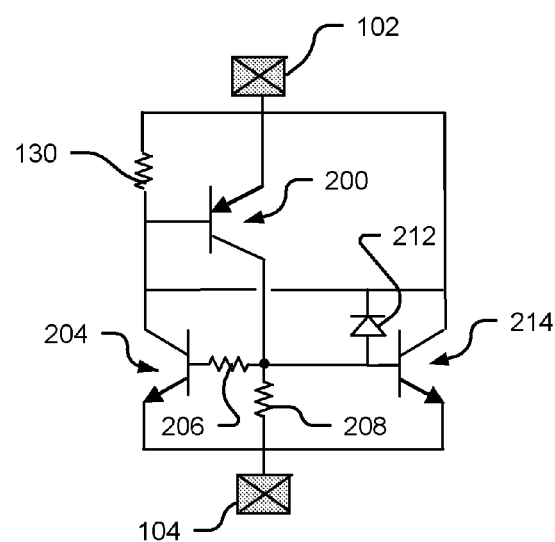
FIG. 2 is a circuit diagram of an example of a model of the ESD circuit of FIG. 1.
Figure 3:
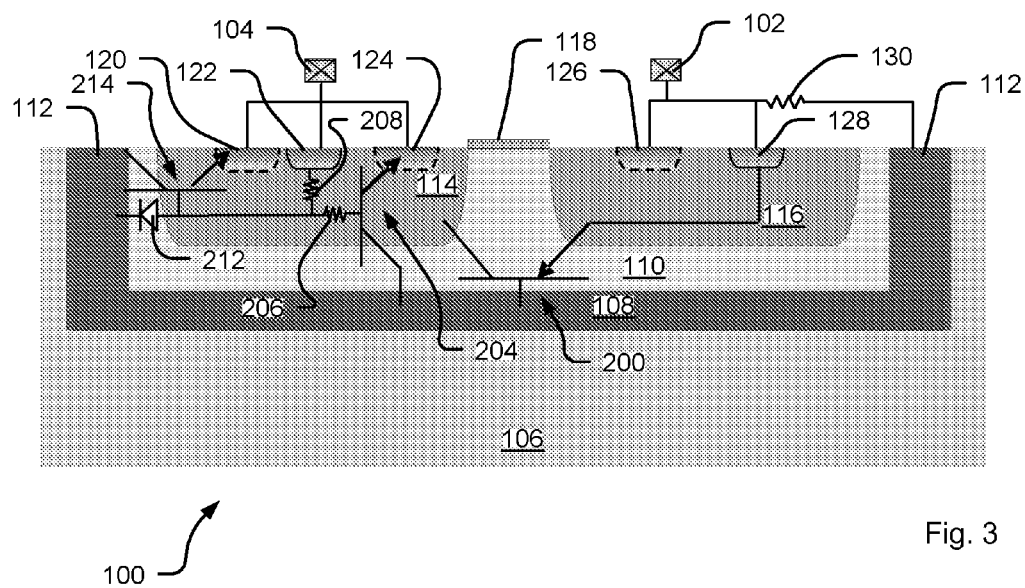
FIG. 3 schematically shows a cross-sectional view of the example of the ESD circuit of FIG. 1 with the circuit diagram of the model of FIG. 2 overlaid.

Turning to FIGS. 2 and 3, the above-described configuration constitutes a circuit structure having a first switching device, in this example the PNP bipolar transistor 200 mentioned above, formed by the first p-region 114, the n-type epitaxial layer 110 and the second p-region 116. An emitter terminal of the PNP transistor 200 is coupled to the external terminal 102 via the second p+region 128. A base terminal of the PNP transistor 200 is coupled, in this example, to the n-type buried layer 108 and hence the lateral isolation region 112. Consequently, the base terminal of the PNP transistor 200 is coupled to the external terminal 102 via the external resistance 130. In this example, and as mentioned above, the base of the PNP transistor 200 is therefore not "floating", i.e. it is electrically coupled to the external terminal 102 via the n-type buried layer 108, the isolation region 112 and the external resistance 130. By not being floating, the base terminal of the PNP transistor 200 does not, when in use, conduct in the presence of an EMI event, but in the absence of an ESD event, and hence supports improved EMC performance.

The second n+ region 124, the first p-region 114 and the n-type epitaxial layer 110 form a second switching device. In this example, the second switching device is a first NPN bipolar transistor 204 having an emitter terminal coupled to the another external terminal 104 and a collector terminal coupled to the n-type buried layer 108 and hence the lateral isolation region 112. Thus, the collector terminal of the first NPN bipolar transistor 204 is connected to the external terminal 104 via the external resistor 130. A base terminal of the first NPN transistor 204 is coupled to the another external terminal 104 via the first p+ region 122 and a first internal resistance 206 and a second internal resistance 208 of the model provided by the first p-region 114. The first PNP bipolar transistor 200 coupled to the first NPN bipolar transistor 204 constitutes a thyristor circuit.

A third switching device, in this example a second NPN bipolar transistor 214, is formed by the junctions of the first n+ region 120, the first p-region 114 and the n-type epitaxial layer 110. An emitter terminal of the second NPN transistor 214 is therefore coupled to the another external terminal 104 and hence the reference potential mentioned above. A base terminal of the second NPN transistor 214 is coupled to the external terminal 104 via the second internal resistance 208. The base of the second NPN transistor 214 is further connected to the base of the first bipolar NPN transistor 204 via the first resistor 206. A collector terminal of the second NPN transistor 214 is coupled to the lateral isolation region 112, and hence the external terminal 102, via the external resistance 130. Hence, the second NPN transistor 204 is coupled to the thyristor circuit. The base-collector diode of the second NPN transistor 214 is also shown schematically as diode 212 having a breakdown voltage associated therewith.

In operation, when a voltage is applied between the external terminal 102 and the another external terminal 104 that is positive (i.e. $V_{102} > V_{104}$) and less than a trigger voltage, $V_{T1}$, of the ESD circuit 100, the first p-region 114 behaves as a collector of the PNP transistor 200, the n-type epitaxial layer 110 behaves as a base of the PNP transistor 200 and the second p-region 116 behaves as an emitter of the PNP transistor 200. A junction between the second p-region 116 and the n-type epitaxial layer 110 therefore becomes forward biased, allowing a small amount of current to flow across the n-type epitaxial region 110 from the second p-region 116 to the first p-region 114. A transient current therefore only flows between the external terminal 102 and the another external terminal 104 and is dependent upon the value of the external resistance 130. In this respect, the external resistance 130 is selected such that it is sufficiently low in value to avoid triggering of the circuit during an EMI event, but high enough to isolate the lateral isolation region 112 and the external pin 102 when the polarity of the voltage across external pin 102 and the another external pin 104 is negative.

Figure 4:
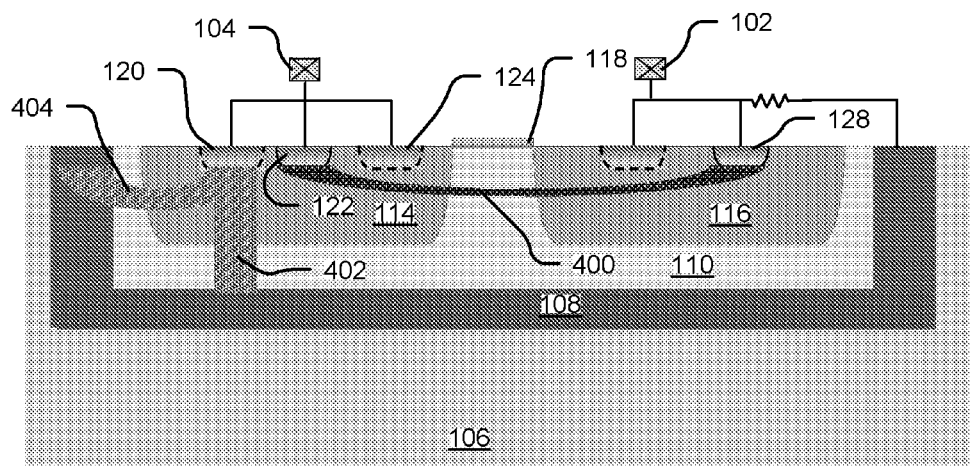
FIG. 4 schematically shows a cross-sectional view of the example of the ESD circuit of FIG. 1 including electron and hole mobility paths in respect of a first state of operation.

When the voltage across the external terminal 102 and the another external terminal 104 reaches or exceeds the trigger voltage, $V_{T1}$, for example when an ESD event occurs, the voltage across the isolation region 112 and the another external terminal 104 increases, because the isolation region 112 and the buried layer 108 are electrically coupled (through resistor 130) to the external terminal 102. Consequently, the junction between the first p-region 114 and the n-type epitaxial layer 110 reaches a breakdown voltage thereof resulting in so-called avalanche breakdown of the p-n junction 114, 110. Also, due to the existence of the ESD event, current flows though the external resistance 130, resulting in the voltage across the forward biased base-emitter p-n junction of the PNP transistor 200 to increase. Consequently, holes 400 (FIG. 4) are injected into the second p-region 116 from the second p+ region 128 and are swept substantially laterally across to the first p-region 114 and flow to the another external terminal 104 via the first p+ region 122. Hence, a current path is provided between the collector terminal and the emitter terminal of the PNP transistor 200.

Depending upon a number of factors, for example the selected value of the breakdown voltage (mentioned above) of the p-n junction formed by the n-type epitaxial layer 110 and the first p-region 114 and represented by the diode 212, the breakdown voltage of the p-n junction formed by the n-type epitaxial layer 110 and the first p-region 114 is reached around the same time as the holes are swept from the second p-region 116 to the first p-region 114. In this respect, the breakdown voltage of the p-n junction formed by the n-type epitaxial layer 110 and the first p-region 114 can be configured by varying a distance, $D_1$ (FIG. 1), between the first p-region 114 and the isolation region 112. This breakdown voltage corresponds to the threshold voltage, $V_{T1}$, and is therefore independently configurable of the thyristor circuit.

Once the breakdown voltage has been reached, a substantially lateral electron current 404 flows from the first n+ region 120 to the isolation layer 112 and hence to the external terminal 102. Additionally, due to the hole current mentioned above flowing through first p-region 114, a voltage drop increasingly exists between the p-n junction formed by the first n+ region 120 and the first p-region 114. When the voltage drop at this junction is sufficiently high, i.e. when the hole current flowing through the first p-region 114 is sufficiently high, for example about 0.6V, the p-n junction becomes forward biased and the second NPN transistor 214 switches on and a vertical electron current 402 also flows from the first n+ region 120 to the buried layer 108, i.e. substantially lateral and vertical current paths is provided.

Figure 5:
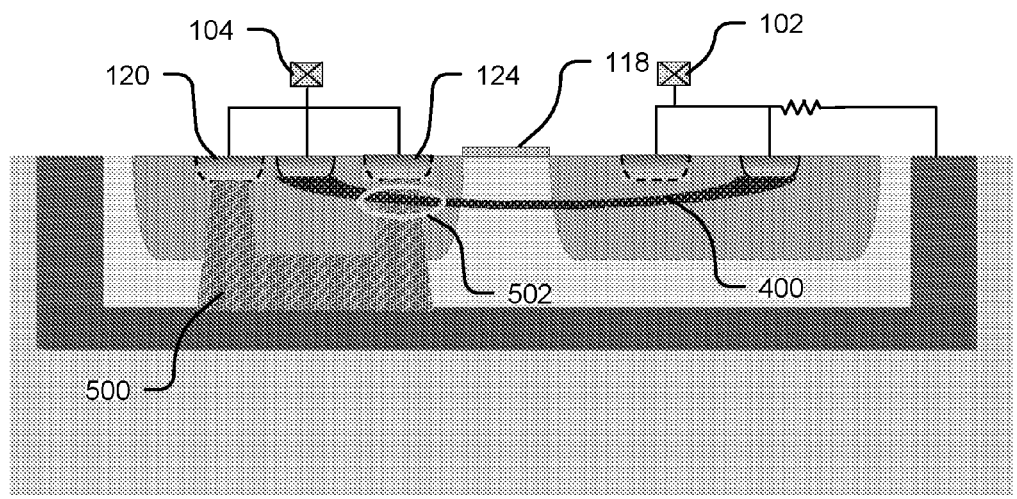
FIG. 5 schematically shows a cross-sectional view of the example of the ESD circuit of FIG. 1 including electron and hole mobility paths in respect of a second state of operation.

Referring to FIG. 5, as the ESD triggering current increases, the hole current 400 in the first p-region 114 increases such that a voltage drop caused by the first and second internal resistances 206, 208, develops between the first p-region 114 and the second n+ region 124, i.e. between the base and emitter of the first NPN transistor 204. When the number of holes accumulated reaches a trigger current value, the junction between the second n+ region 124 and the first p-region 114 becomes forward biased and the first NPN transistor 204 is triggered and switches on, resulting in a vertical electron current 500 flowing from the first n+ region 120 and the second n+ region 124 to the buried layer 108 and hence the external terminal 102.

As can be seen from FIG. 5, the flow of holes 400 and the vertical electron flow 500 overlap in a region 502 resulting in SCR circuit operation or thyristor functionality. In this respect, the base of the PNP transistor 200 is electrically coupled to the collector of the first NPN transistor 204 and the base of the first NPN transistor 204 is electrically coupled to the collector of the PNP transistor 200. As is known in relation to SCR circuits, the respective gains of the first NPN transistor 204 and the PNP transistor 200 compound each other, enabling a large amount of current to be shunted from the external terminal 102 to the another external terminal 104, i.e. a current or conductive path is provided in response to an ESD event associated with the external terminal 102. The SCR possesses the trigger voltage, $V_{T1}$, mentioned above and the snapback voltage, $V_{SB}$, the trigger voltage being adjustable by virtue of the second NPN transistor 214. Also, the SCR self-unlatches when current flowing between the external terminal 102 and the another external terminal 104 falls below the latch, or snapback, current, $I_{SB}$.

Figure 6:
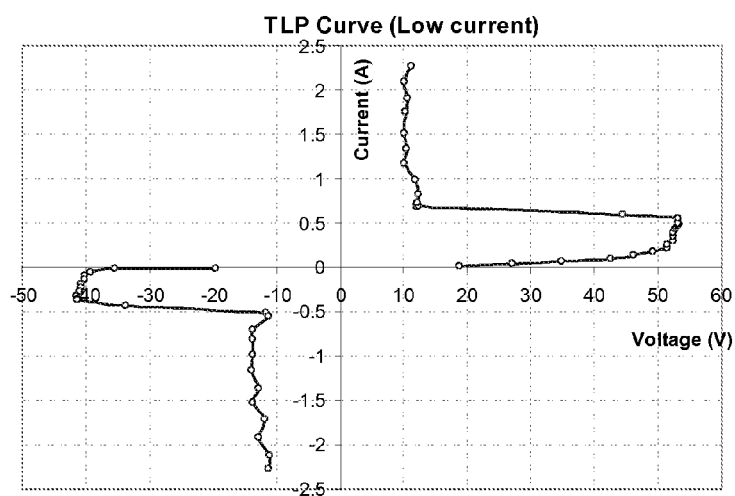
FIG. 6 is a graph of a voltage-current characteristic of the example ESD circuit of FIGS. 1 and 2 in respect of a low level of current.

Turning to FIG. 6, for currents flowing between the external terminal 102 and the another external terminal 104 of up to 500 mA, the ESD circuit 100 operates in a so-called bipolar region. However, when an ESD event occurs and the ESD current exceeds 500 mA, the ESD 100 enters an SCR regime and the voltage across the external terminal 102 and the another external terminal 104 drops to, in this example, about 10V.

It is thus possible to provide an electronic device, an integrated circuit, and the electro-static discharge protection circuitry therein, as described above that provision of a tuneable latch current, for example the latch current can be set to a current greater than 300 mA, dual-polarity operation capability, a selectable trigger voltage, and a tuneable snapback voltage. It is also possible to provide low die space consumption, a low sensitivity to electromagnetic disturbances and an ability to self-unlatch at currents below the tuneable latch current, as well as an epitaxial layer that has a very low leakage current.

Of course, the above advantages are exemplary, and these or other advantages may be achieved by the invention. Further, the skilled person will appreciate that not all advantages stated above are necessarily achieved by embodiments described herein.

In the foregoing specification, the invention has been described with reference to specific examples of embodiments of the invention. It will, however, be evident that various modifications and changes may be made therein without departing from the broader spirit and scope of the invention as set forth in the appended claims.

In particular, it is envisaged that the aforementioned inventive concept can be applied by a semiconductor manufacturer to any integrated circuit architecture in which ESD protection is required.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Also, the terms "to couple and "coupled" as used, cover any suitable type of connection. The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Also for example, in one embodiment, the illustrated examples may be implemented as circuitry located on a single integrated circuit or within a same device. For example, an integrated circuit requiring ESD protection of its pins. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An integrated circuit comprising electro-static discharge, ESD, protection circuitry arranged to provide ESD protection to an external terminal of the integrated circuit, the ESD protection circuitry comprising:
   a thyristor circuit comprising a first bipolar switching device operably coupled to the external terminal and a second bipolar switching device operably coupled to another external terminal, a collector of the first bipolar switching device being coupled to a base of the second bipolar switching device and a base of the first bipolar switching device being coupled to a collector of the second bipolar switching device; and
   a third bipolar switching device having a base terminal operably coupled to the thyristor circuit and having a threshold voltage for triggering the thyristor circuit to provide a current path from the external terminal to the another external terminal, the threshold voltage being independently configurable of the thyristor circuit; wherein
   the first and second switching devices, when in use, exhibiting a bidirectional snapback characteristic and a snapback voltage associated therewith.

2. A circuit as claimed in claim 1, wherein the thyristor circuit is a Silicon-Controlled Rectifier.

3. A circuit as claimed in claim 1, wherein the first bipolar switching device is a PNP bipolar transistor.

4. A circuit as claimed in claim 1, wherein the second bipolar switching device is a first NPN bipolar transistor.

5. A circuit as claimed in claim 1, wherein the third bipolar switching device is a second NPN bipolar transistor.

6. A circuit as claimed in claim 1, wherein a base of the third switching device is also coupled to the collector of the first switching device.

7. A circuit as claimed in claim 1, wherein an emitter of the second bipolar switching device is coupled to an emitter of the third bipolar switching device.

8. A circuit as claimed in claim 1, wherein an emitter terminal of the first switching device is coupled to the external terminal via an external resistance.

9. A circuit as claimed in claim 1, wherein the first bipolar switching device provides, when in use, a first current path from the collector to the emitter of the first bipolar switching device when a voltage across the external terminal and the another external terminal exceeds a trigger voltage, and the second bipolar switching device provides a second substantially lateral current path and a third substantially vertical current path.

10. A circuit as claimed in claim 9, wherein the first bipolar switching device is arranged to provide, when a current associated with an electrostatic discharge event exceeds a predetermined trigger current value, a fourth substantially vertical current path that crosses the first current path, thereby providing thyristor functionality in response thereto.

11. A circuit as claimed in claim 1, further comprising a semiconductor substrate and a layer of n-type material disposed adjacent the semiconductor substrate.

12. A circuit as claimed in claim 11, further comprising:
   a first p-region disposed in the n-type material and a second p-region disposed in the n-type material, the first and second p-regions being laterally spaced with respect to each other;
   a first p+ region disposed between a first n+ region and a second n+ region in the first p-region, the first n+ region, the second n+ region and the first p+ region being laterally spaced with respect to each other; and
   a third n+ region and a second p+ region disposed in the second p-region and laterally spaced with respect to each other.

13. A circuit as claimed in claim 12, wherein the external terminal is operably coupled to the third n+ region and the second p+ region, the external terminal constituting a second common contact.

14. A circuit as claimed in claim 12, wherein the another external terminal is operably coupled to the first n+ region, the first p+ region and the second n+ region, the another external terminal constituting a first common contact.

15. A circuit as claimed in claim 12, wherein a lateral distance between the first p-region and the second p-region defines a snapback voltage of the thyristor circuit.

16. A circuit as claimed in claim 12, further comprising:
   a lateral isolation layer disposed opposite the first p-region, a lateral distance between the first p-region and the lateral isolation layer defining the trigger voltage for the thyristor circuit.

17. A circuit as claimed in claim 11, wherein the layer of n-type material is operably coupled to a biasing element.

18. An electronic device comprising the integrated circuit of claim 1.

19. A method of providing electro-static discharge, ESD, protection to an external terminal of an integrated circuit, the method comprising:
   providing a thyristor circuit coupled across the external terminal and another external terminal in order to provide a current path from the external terminal to the another external in response to an ESD event associated with the external terminal; and
   a third bipolar switching device operably coupled to the thyristor circuit, the third bipolar transistor triggering the thyristor circuit in response to a voltage of the ESD event exceeding a threshold voltage associated with the third bipolar switching device, thereby providing the current path from the external terminal to the another external terminal in order to provide a conductive path for the ESD event; wherein
   the threshold voltage is independently configurable of the thyristor circuit; and the thyristor circuit, when in use, exhibits a bidirectional snapback characteristic and a snapback voltage associated therewith.

\* \* \* \* \*